United States Patent [19]
Gillard

[11] Patent Number: 5,881,179
[45] Date of Patent: *Mar. 9, 1999

[54] FREQUENCY SEPARATION OF IMAGE DATA

[75] Inventor: Clive Henry Gillard, Basingstoke, United Kingdom

[73] Assignees: Sony Corporation, Tokyo, Japan; Sony United Kingdom Limited, Weybridge, England

[ * ] Notice: This patent issued on a continued prosecution application filed under 37 CFR 1.53(d), and is subject to the twenty year patent term provisions of 35 U.S.C. 154(a)(2).

[21] Appl. No.: 598,698

[22] Filed: Feb. 8, 1996

[30] Foreign Application Priority Data

Feb. 20, 1995 [GB] United Kingdom .................. 9503298

[51] Int. Cl.⁶ ...................................................... G06K 9/40
[52] U.S. Cl. ........................................... 382/261; 382/265
[58] Field of Search ................................... 382/261, 265, 382/240

[56] References Cited

U.S. PATENT DOCUMENTS

| | | | |
|---|---|---|---|
| 5,068,911 | 11/1991 | Resnikoff et al. | 382/240 |
| 5,097,331 | 3/1992 | Chen et al. | 358/138 |
| 5,359,674 | 10/1994 | Van Der Wal | 382/261 |
| 5,583,952 | 12/1996 | Resnikoff et al. | 382/240 |

FOREIGN PATENT DOCUMENTS 2262854  6/1993  United Kingdom .

WO 92/02897  2/1992  WIPO .

OTHER PUBLICATIONS

IEEE Journal On Selected Areas In Communications, vol. 7, No. 5, Jun. 1989, pp. 789/800 XP000036740 Darragh J C et al: "Fixed Distortion Subband Coding of Images for Packet–Switched Networks" *left–hand column, line 6—line 13: figure 4*.

*Primary Examiner*—David K. Moore
*Assistant Examiner*—Stephen Brinich
*Attorney, Agent, or Firm*—Frommer Lawrence & Haug, LLP.; William S. Frommer

[57] ABSTRACT

Apparatus for frequency-separating input image data, the apparatus comprises a data buffer; a multi-stage filter for performing successive spatial filtering operations on input image data, the multi-stage filter having:

(i) a first filtering stage for frequency-separating the input image data into image data representing at least two spatial frequency bands; and (ii) one or more subsequent filtering stages for receiving a subset of image data output by the preceding stage and frequency-separating that image data into image data representing two or more spatial frequency bands;

in which data output by each stage which is not part of the subset of the image data to be filtered by a subsequent filtering stage is supplied to the data buffer; and means for combining image data output by the last of the filtering stages and image data buffered in the data buffer.

17 Claims, 5 Drawing Sheets

FREQUENCY SEPARATION OF IMAGE DATA

BACKGROUND OF THE INVENTION

1. Field of the Invention

This invention relates to the frequency separation of image data.

2. Description of the Prior Art

Frequency-separation of image data is a well-established technique, and is particularly useful as part of a data compression process. The image data can be divided into different spatial frequency bands, and a different degree of quantisation or other lossy processing applied to the bands in dependence on the relative importance of each band to the reconstructed picture.

One recently proposed technique for image data frequency separation is the so-called "wavelet" coding technique. In this technique, the resulting spatial frequency bands vary in size in dependence on the frequency range of the bands.

Figure 1A:
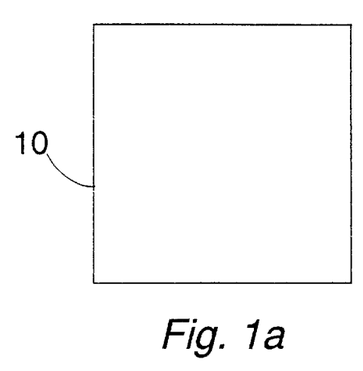
FIGS. 1a to 1d schematically illustrate a wavelet encoding process.
Figure 1B:
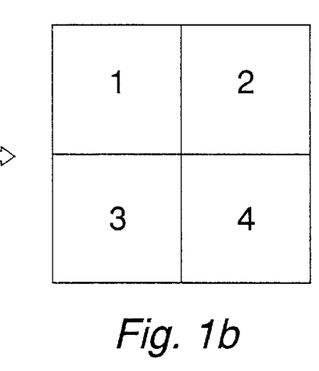

An example of the wavelet coding technique is illustrated schematically in FIGS. 1a to 1d of the accompanying drawings. An input image 10 (FIG. 1a) is horizontally and vertically decimated (by a decimation factor of two in each direction) to form four spatial frequency bands 1, 2, 3 and 4 (FIG. 1b).

Figure 1C:
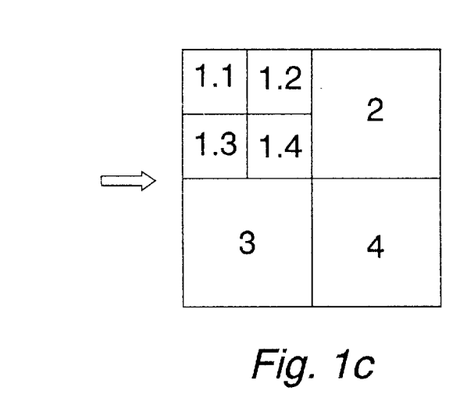
Figure 1D:
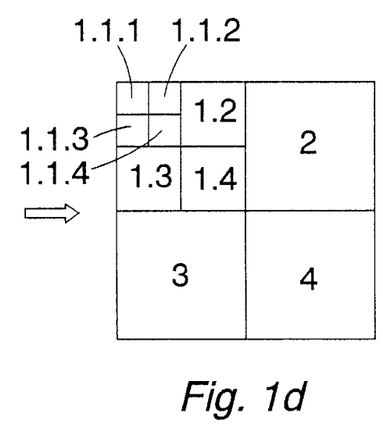

In FIGS. 1b, 1c and 1d, horizontal spatial frequency increases from band to band in a left-to-right horizontal direction, and vertical spatial frequency increases from band to band in a top-to-bottom vertical direction. Accordingly, in FIG. 1b, the top left band 1 represents the lowest horizontal and vertical spatial frequencies.

As shown in FIG. 1c, the band 1 (but not the bands 2, 3 and 4) is then horizontally and vertically decimated to form four further bands, 1.1, 1.2, 1.3 and 1.4. Of these, only the lowest spatial frequency band 1.1 is further separated to form bands 1.1.1, 1.1.2, 1.1.3 and 1.1.4.

Figure 2:
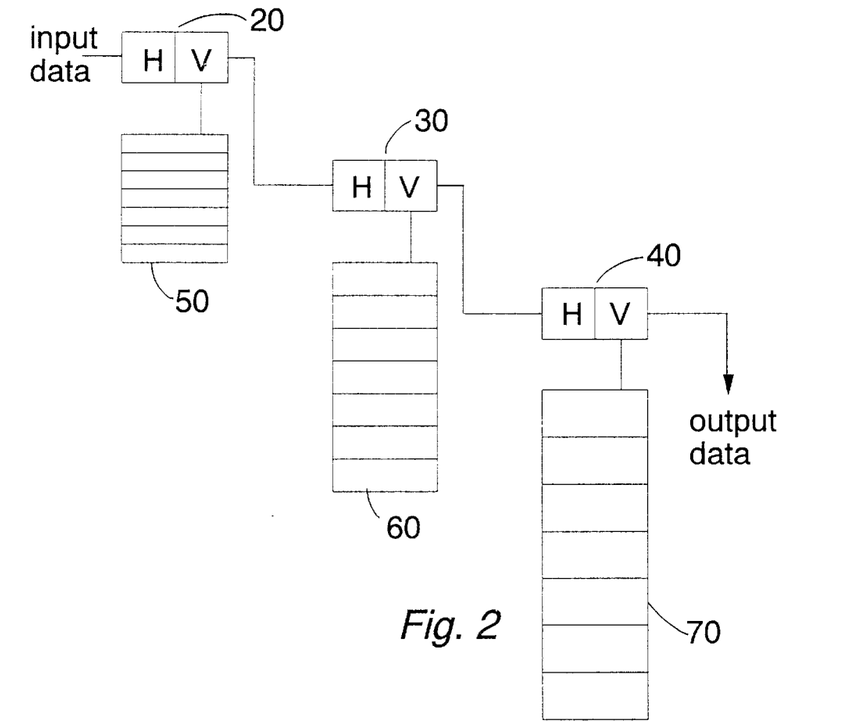
FIG. 2 is a schematic diagram of a previously proposed wavelet encoder.
Figure 3A:
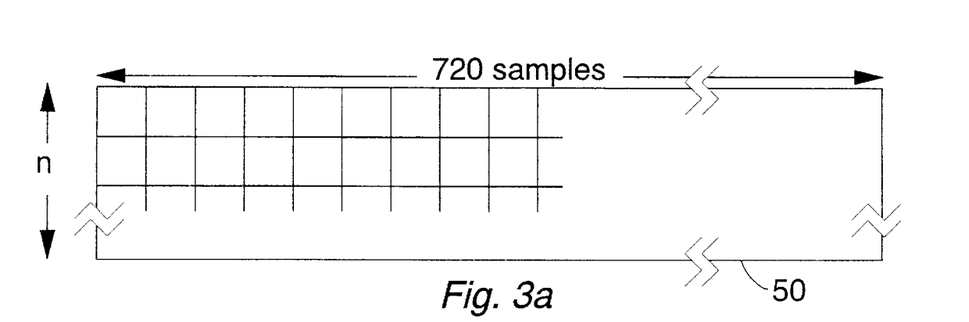
FIGS. 3a to 3c are schematic diagrams of line buffers in the encoder of FIG. 2.
Figure 3B:
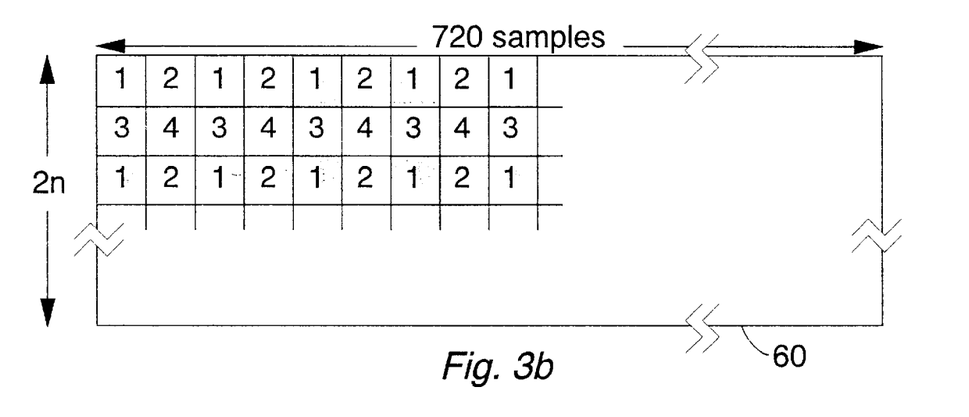
Figure 3C:
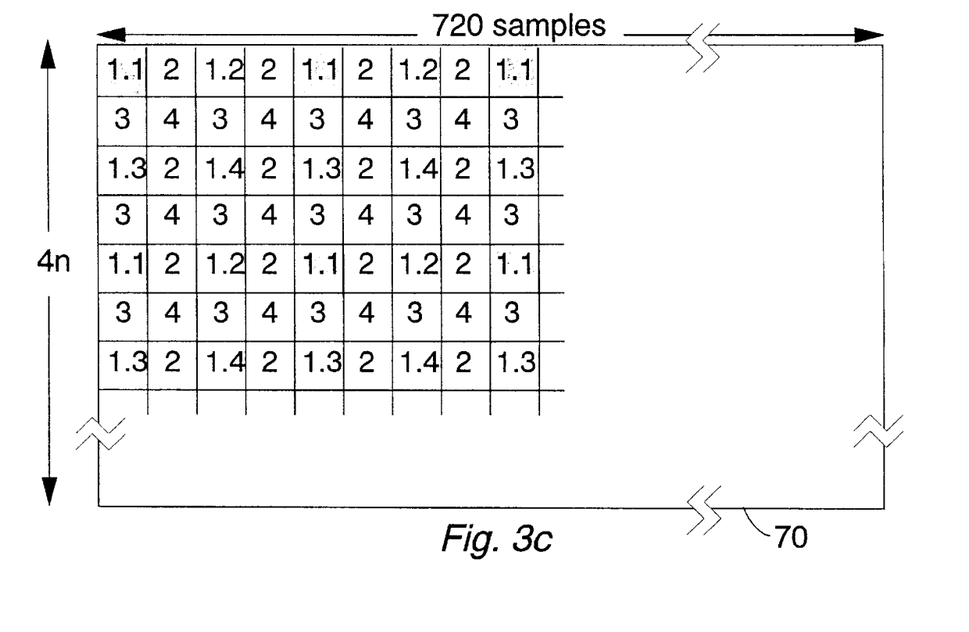

FIG. 2 of the accompanying drawings schematically illustrates a previously proposed wavelet encoder, and FIGS. 3a to 3c of the accompanying drawings schematically illustrate the data structure within line buffers of the encoder of FIG. 2.

In FIG. 2, input image data is subjected to horizontal and vertical decimation by a first horizontal and vertical filter stage 20. (Suitable filters are described in British published patent application no. 2 262 854). The four spatial frequency bands generated by the first filtering stage 20 (i.e. the bands 1, 2, 3 and 4 of FIG. 1b) are then passed, multiplexed together, to a second filter stage 30. This stage decimates the band 1 to generate the four bands 1.1, 1.2, 1.3 and 1.4 and passes these, together with the bands 2, 3 and 4 (which have not been filtered by the second stage 30) to a third filter stage 40. The third filter stage 40 decimates the band 1.1 to generate the bands 1.1.1, 1.1.2, 1.1.3 and 1.1.4. The entire band structure of FIG. 1d is then output by the third filter stage 40.

Each filter stage 20, 30 and 40 comprises horizontal and vertical multi-tap finite impulse response (FIR) decimation filters. The horizontal FIR filters simply process groups of samples along a single line of the image, but the vertical FIR filters require line buffers or memories 50, 60 and 70 to provide line-delayed samples for the filtering process.

The line buffer 50, associated with the first filter stage 20, has to store n lines for an n-tap vertical filtering process. However, because of the way in which the output data from the first and second filter stages is multiplexed together (to be described below with reference to FIGS. 3a to 3c of the accompanying drawings) the line buffers 60 and 70 have to store 2n lines and 4n lines respectively.

FIGS. 3a to 3c schematically illustrate the data structures in the line buffers 50, 60 and 70 respectively.

FIG. 3a shows the structure of the line buffer 50, which is one line wide (in this example, 720 samples wide) and n lines deep to allow for an n-tap vertical filtering process carried out by the first filter stage 20.

In the data output by the first filter stage 20, samples from the four bands 1, 2, 3 and 4 are multiplexed together in square groups of four (2×2) samples. The second filter stage filters only those samples from the band 1 (shown shaded in FIG. 3b), but because such samples occur only every second line of the multiplexed data generated by the first filter stage 20, in order to buffer a vertical group of n samples from band 1 a 2n-line buffer 60 is required.

The second filter stage 30 generates output data in which the four bands 1.1, 1.2, 1.3 and 1.4 are multiplexed with data representing bands 2, 3 and 4 from the first filter stage 20. The third filter stage acts only on samples from the band 1.1, but since these occur only every fourth line of data from the second filter stage, the line buffer 70 has to store 4n lines to perform an n-tap vertical filtering operation.

Wavelet encoders of the type illustrated in FIG. 1 are often implemented as application specific integrated circuits (ASICs). However, it is a severe burden to have to provide the line buffers 50, 60, 70 to store n+2n+4n lines of image data. Indeed, in order to produce line buffers of this type it is often necessary to use up to 5 ASIC gates per stored bit.

SUMMARY OF THE INVENTION

This invention provides apparatus for frequency-separating input image data, the apparatus comprising:

a data buffer;

a multi-stage filter for performing successive spatial filtering operations on input image data, the multi-stage filter having:
  (i) a first filtering stage for frequency-separating the input image data into image data representing at least two spatial frequency bands; and
  (ii) one or more subsequent filtering stages for receiving a subset of image data output by the preceding filtering stage and frequency-separating that image data into image data representing two or more spatial frequency bands;

in which data output by each stage which is not part of the subset of the image data to be filtered by a subsequent filtering stage is supplied to the data buffer; and means for combining image data output by the last of the filtering stages and image data buffered in the data buffer.

The invention addresses the problem of providing larger and larger line buffers at each stage of a wavelet encoder (for example), by changing the way in which the data output by each filtering stage is handled. Instead of the filtered output data from each stage being multiplexed together, as shown in FIGS. 1 to 3c described above, the data are separated out so that only the relevant data for a subsequent filtering stage are supplied to that filtering stage; the remaining data is buffered, to be recombined with the output of the last filtering stage at the output of the apparatus.

Accordingly, instead of the increasing line buffer requirements of the circuit of FIG. 1, the line buffer requirements of successive filtering stages of an apparatus according to the invention actually decrease and, in many cases, the total storage requirements of the line buffers would tend towards a finite limit even if a large number of stages were used.

The data could be buffered in an off-chip buffer, thus saving gates in an ASIC design of the apparatus. (Alternatively, in a larger ASIC the buffer could be provided on-chip, but here the much larger scale of the buffer would lead to a much more efficient implementation in ASIC, taking perhaps 1 gate (or even closer to the theoretical limit of 0.5 gates) per bit rather than the 5 gates per bit required for the line buffers).

The output combination of buffered data and data from the last filtering stage could be performed using a multiplexer or alternatively could simply be carried out by controlling the reading times of data from the data buffer to interleave with data output times from the last filtering stage.

Although the subset of data to be filtered by each subsequent stage could be drawn from a number of the spatial frequency bands output by the preceding stage, it is preferred (for the purposes of wavelet coding) that the subset of image data consists of one of the spatial frequency bands output by the preceding filtering stage.

Preferably each filtering stage performs horizontal decimation by a decimation factor of two and vertical decimation by a decimation factor of two, thereby performing frequency separation into four spatial frequency bands.

Although various numbers of filtering stages could be used, it is preferred that the multi-stage filter is a three-stage filter.

Advantageously, the multi-stage filter and the data buffer are disposed on separate respective integrated circuit substrates. This avoids the need to provide large memory circuits on, for example, an ASIC circuit containing the filtering stages.

Preferably each stage of the multi-stage filter comprises one or more multi-tap finite impulse response digital filters.

Although the multi-stage filter could be embodied as a plurality of series-connected filter devices, in an alternative embodiment the multi-stage filter comprises a single filter device for performing each filtering operation of the multi-stage filtering process, in which the subset of data output by the device at each stage in the multi-stage filtering process is fed back to the input of the device.

Frequency-separating apparatus as described above is particularly suitable for use in data compression apparatus.

This invention also provides apparatus for frequency-combining (re-combining) frequency-separated input image data, the apparatus comprising:

a data buffer;

a multi-stage filter for performing successive spatial filtering operations on input image data;

means for demultiplexing the input image data into a first subset to be supplied to a first stage of the multi-stage filter and a second subset to be buffered in the data buffer;

the multi-stage filter having:
(i) a first filtering stage for frequency-combining the first subset of the input image data; and
(ii) one or more subsequent filtering stages for frequency-combining the image data output by the preceding filtering stage with further image data from the second subset buffered in the data buffer.

The frequency-combining apparatus is particularly suitable for use in data decompression apparatus.

This invention also provides a digital video tape recorder/player comprising apparatus as defined above.

This invention also provides a method of frequency-separating input image data, the method comprising the steps of:

performing a first filtering operation to frequency-separate the input image data into image data representing at least two spatial frequency bands;

performing one or more subsequent frequency-separating filtering operations, each subsequent operation comprising filtering a subset of the data output by the preceding filtering operation;

buffering data output by each filtering operation which is not part of the subset of the image data to be filtered by a subsequent filtering operation in a data buffer; and combining image data output by the last of the filtering operations and image data buffered in the data buffer.

This invention also provides a method of frequency-combining frequency-separated input image data, the method comprising the steps of:

demultiplexing the input image data into a first subset and a second subset;

buffering the second subset of image data in a data buffer;

performing a first frequency-combining filtering operation on the first subset of the input image data; and performing one or more subsequent frequency-combining filtering stages, each operating on the image data output by the preceding filtering stage and further image data from the second subset buffered in the data buffer.

Preferred features of the above apparatus are equally applicable to the above methods, and vice versa. Similarly, corresponding preferred features apply to the frequency-separating and frequency-combining apparatus and methods.

BRIEF DESCRIPTION OF THE DRAWINGS

The above and other objects, features and advantages of the invention will be apparent from the following detailed description of illustrative embodiments which is to be read in connection with the accompanying drawings, in which.

DESCRIPTION OF THE PREFERRED EMBODIMENTS

Figure 4:
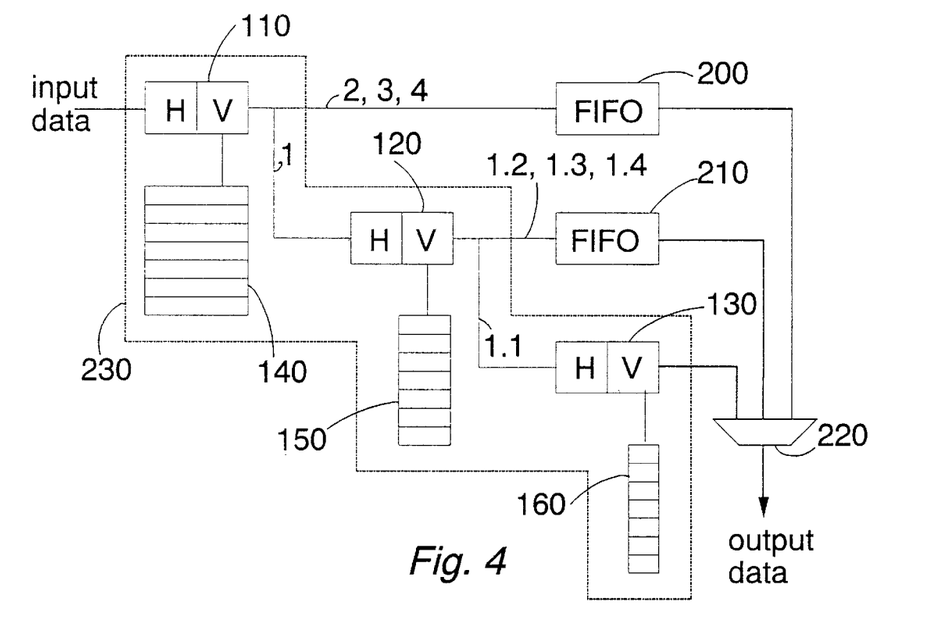
FIG. 4 is a schematic diagram of a wavelet encoder according to an embodiment of the present invention.
Figure 5A:
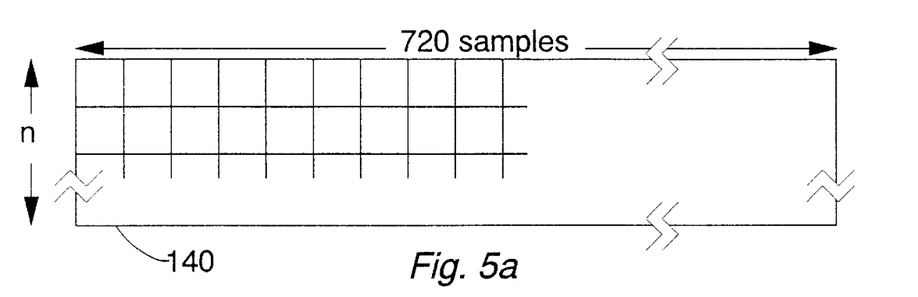
FIGS. 5a to 5c are schematic diagrams of line buffers in the encoder of FIG. 4.
Figure 5B:
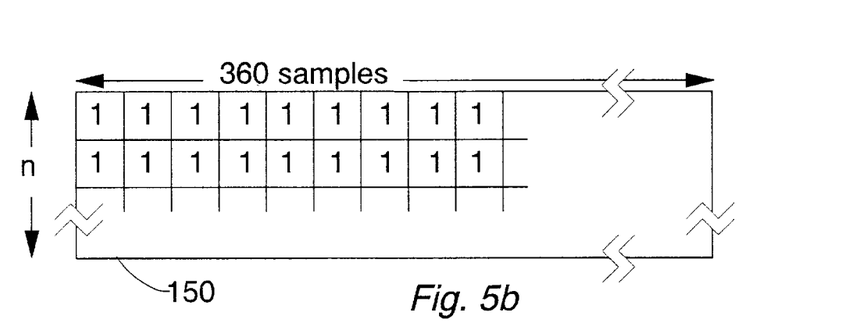
Figure 5C:
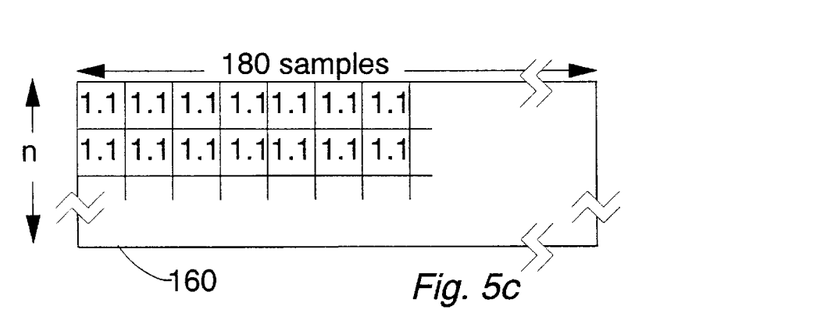

FIG. 4 is a schematic diagram of a wavelet encoder according to an embodiment of the present invention. FIGS. 5a to 5c are schematic diagrams of line buffers in the encoder of FIG. 4.

In FIG. 4, input image data is subjected to horizontal and vertical decimation by a first horizontal and vertical filter stage 110. In a similar manner to the filter stage 20 of FIG. 2, the first filter stage 110 generates the four bands 1, 2, 3 and 4 of FIG. 1b. Of these, bands 2, 3 and 4 (which are not to be subject to further filtering) are routed to a first-in-first-out (FIFO) memory 200. Only data corresponding to the band 1 is routed to a second filter stage 120.

The second filter stage 120 performs horizontal and vertical decimation on the data representing the band 1, to generate the bands 1.1, 1.2, 1.3 and 1.4 of FIG. 1c. However, only the data representing band 1.1 is routed to a third filter stage 130; the remaining bands (1.2, 1.3 and 1.4) are stored in a FIFO 210.

The third filter stage 130 performs horizontal and vertical decimation of data representing the band 1.1, to generate the four bands 1.1.1, 1.1.2, 1.1.3 and 1.1.4.

Finally, data stored in the FIFO 200, data stored in the FIFO 210 and the output data of the third filter stage 130 are combined by an output multiplexer 220 to generate the output (frequency separated) data of FIG. 1d.

In order to perform vertical FIR filtering, the filter stages 110, 120 and 130 use respective line buffers 140, 150 and 160. The data structure of these line buffers is illustrated schematically in FIGS. 5a to 5c.

Once again, it is assumed that n-tap vertical FIR filtering is performed by each of the filter stages 110, 120 and 130. Accordingly, the line buffer 140 is one line wide (once again, in this example, 720 samples wide) and n lines deep (FIG. 5a).

The second filter stage 120 operates on only the band 1, which has been horizontally decimated by a factor of 2 with respect to the original image 10. Accordingly, the line buffer 150 needs only to be one-half of one line wide (in this example, 360 samples wide). Also, since the relevant samples to be used in the vertical filtering process are not separated by two lines (as they are in FIG. 3b above) the line buffer 150 needs be only n lines deep (FIG. 5b).

Similarly, the third filter stage 130 operates on the band 1.1, which has been horizontally decimated by a factor of 2 from the band 1. Accordingly, the line buffer 160 need be only 180 samples (one quarter of one line) wide, and n lines deep (FIG. 5c).

The buffer sizes therefore form a decreasing geometric series, according to the following formula:

$$\text{total buffer size required} = \sum_{i=0}^{i=m} \frac{n \text{ linewidths}}{p^i}$$

where m is the number of filtering stages used, n is the number of taps in the vertical FIR filters used, and p is the horizontal decimation factor (in this case, 2). The limit of this formula, even if a very large number of filter stages was used, is 2n(line widths).

In FIG. 4, the FIFOs 200, 210 are shown as separate devices. However, it will be appreciated that the two FIFOs could be implemented using the same device. Although the FIFOs 200, 210 could be implemented as part of the same ASIC as the filter stages and line buffers, in the present embodiment the filter stages and line buffers are formed as one ASIC device 230, and the FIFOs are implemented as external (off-chip) memory devices. This dramatically relieves the burden on gate usage in the ASIC devices.

Figure 6:
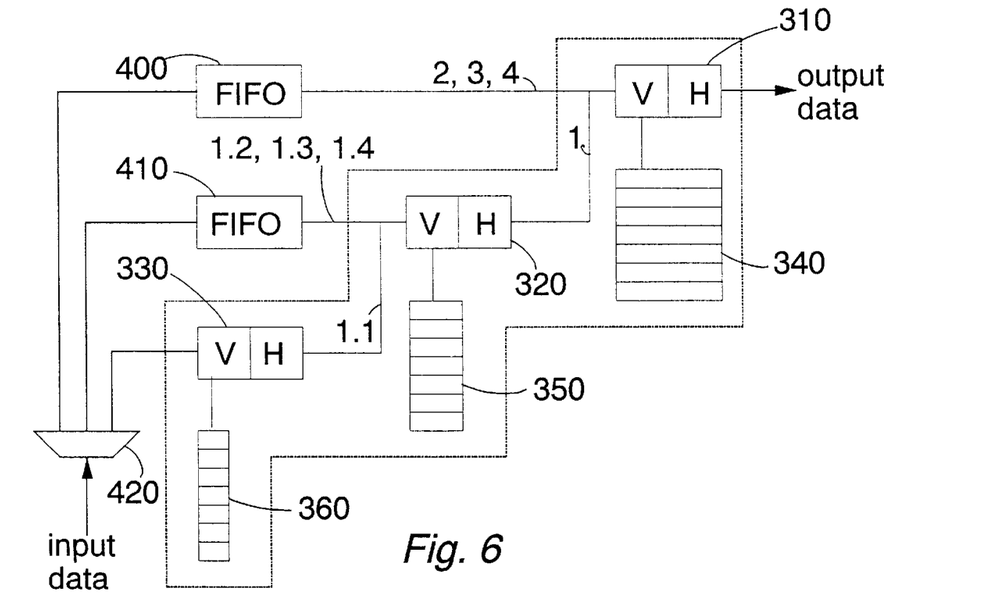
FIG. 6 is a schematic diagram of a wavelet decoder according to an embodiment of the invention.

FIG. 6 is a schematic diagram of a wavelet decoder comprising three successive filter stages 330, 320 and 310, with associated line buffers 360, 350 and 340.

The operation of the decoder of FIG. 6 is complementary (and very similar) to the operation of the encoder of FIG. 4.

Input data is supplied to a demultiplexer 420, which routes data corresponding to the bands 2, 3 and 4 to a FIFO 400, data corresponding to the bands 1.2, 1.3 and 1.4 to a FIFO 410 and the remaining data (corresponding to the bands 1.1.1 to 1.1.4) to the filter stage 330.

The filter stage 330 performs vertical and horizontal interpolation of the bands 1.1.1 to 1.1.4, to generate data corresponding to a band 1.1. In doing this, the filter stage 330 carries out multi-tap FIR vertical and horizontal filtering operations.

The filter stage 320 receives the band 1.1 from the filter stage 330 and the remaining bands 1.2 to 1.4 from the FIFO 410. The filter stage 320 then performs frequency combination (interpolation) operations to generate the band 1, which is supplied to the filter stage 310 along with the bands 2, 3 and 4 from the FIFO 400. The filter stage 310 then generates the output image data by interpolation of the bands 1, 2, 3 and 4.

Accordingly, by symmetry with the encoder of FIG. 4, it will be seen that the line buffer 360 required for vertical filtering by the filter stage 330 is of identical size (for an identical number of taps used in the filtering process) to the line buffer 160; the line buffer 350 is identical to the line buffer 150; and the line buffer 340 is identical to the line buffer 140. Once again, the filter stages and line buffers could be embodied as a single ASIC, with the FIFOs 400, 410 (or a single corresponding device) embodied as an off-chip external memory device (or devices).

Figure 7:
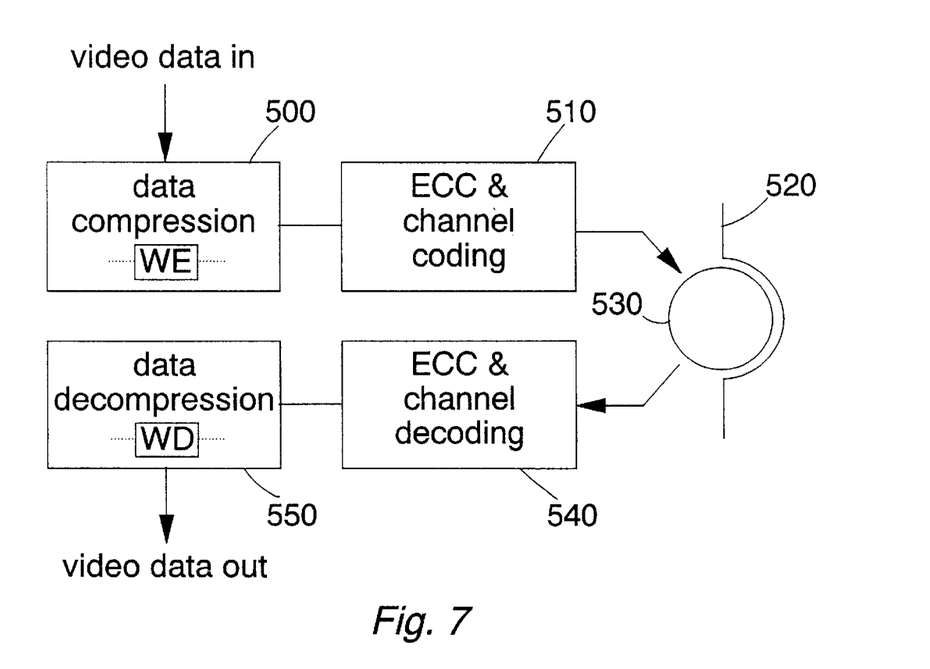
FIG. 7 is a schematic diagram of a digital video tape recorder employing the wavelet encoder of FIG. 4 and the wavelet decoder of FIG. 6.

FIG. 7 is a schematic diagram of a digital video tape recorder (DVTR) employing the encoder of FIG. 4 and the decoder of FIG. 6. In particular, video data is supplied to a data compression apparatus 500 employing wavelet encoding. Such a device is described in, for example, British published patent application no. 2 270 811. Wavelet encoding has also been suggested for use in place of discrete cosine transform (DCT) encoding in the motion picture experts group (MPEG) data compression technique.

The compressed video data is then subjected to error correction coding and channel coding in an ECC and channel coder 510. Coding of this type is described in many references, such as the book "Introduction to the 4:2:2 digital video tape recorder" (Stephen Gregory, Pentech Press, 1988). After ECC and channel coding, the data is recorded on a magnetic tape 520) by magnetic heads mounted on a rotary head drum 530.

On replay, data is read from the tape 520 by replay heads (which may be the same as the record heads) mounted on the head drum 530, and is supplied to an ECC and channel decoder 540. After this stage, the data is decompressed by a data decompression apparatus 550 which incorporates a stage of wavelet decoding.

Figure 8:
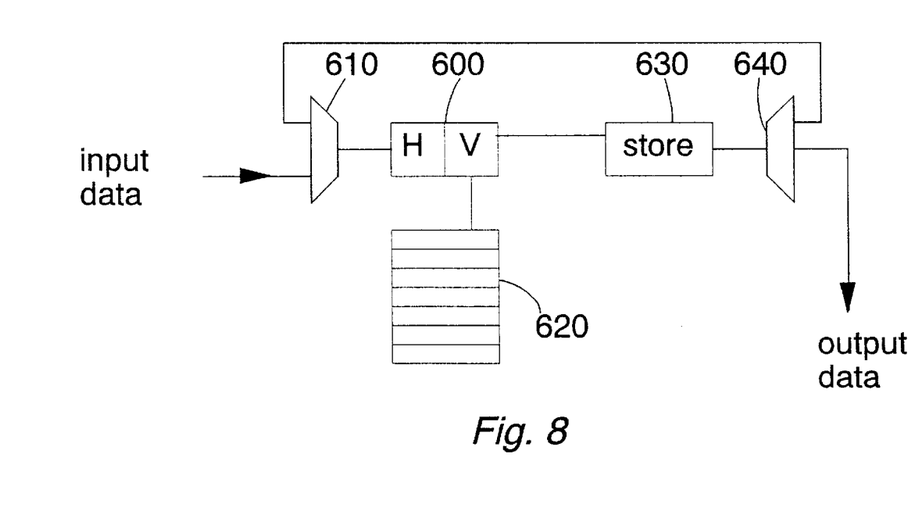
FIG. 8 is a schematic diagram of a further embodiment of a wavelet encoder.

Finally, FIG. 8 is a schematic diagram of a further embodiment of a wavelet encoder. The complementary decoder using the same techniques would be symmetrically related to the circuit of FIG. 8 in the same way as the circuits of FIGS. 4 and 6 are related.

The apparatus of FIG. 8 employs a single filtering stage 600 operating at a higher than normal processing speed. In a single field or frame period, the filter stage 600 actually operates three times to perform each of the three stages of filtering shown in FIGS. 4 and 6.

Input data is supplied first to a multiplexer 610. This routes the input data to the filter stage 600 which carries out horizontal and vertical decimation (for a wavelet encoder) or interpolation (for a wavelet decoder) using a line buffer 620 which is the same size as the line buffers 140 and 340.

The filtered data is supplied to a frame store 630, from which data representing the lowest spatial frequency band output by that stage of filtering (on the first stage, this is the band 1) is output and routed via a demultiplexer 640 back to the multiplexer 610 and to the filter stage 600. The remaining data is not read from the store 630 at this stage.

The second stage of filtering is then carried out, and the resulting filtered data is stored in the FIFO 630. Again, only the relevant data for the next filtering stage is returned via the demultiplexer 640 and the multiplexer 610 to the filter stage 600; the remaining data is not read from the store 630.

Finally, when the filter stage 600 has completed the third required filtering operation, the resulting filtered data from the third stage is stored in the frame store 630. The contents of the frame store 630 (representing all of the bands 1.1.1 to 4) is then read and routed for output by the demultiplexer 640.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

I claim:

1. Apparatus for frequency-separating input image data, the apparatus comprising:

data buffer means for buffering said image data, a multi-stage filter for performing successive spatial filtering operations on input image data, said multi-stage filter having filtering stages including:

(i) a first filtering stage for frequency-separating said input image data into image data representing at least two spatial frequency bands; and (ii) one or more subsequent filtering stages for receiving a subset of image data output by a preceding filtering stage and frequency-separating the received subset of image data into image data representing two or more spatial frequency bands;

wherein, each filtering stage of said multi-stage filter includes a horizontal/vertical decimation stage comprised of a horizontal filtering stage and a vertical filtering stage for performing respective horizontal/vertical decimation on said image data and a line buffer for storing vertical lines of said subset of image data from the preceding filtering stage, wherein each line buffer is smaller in buffer size in successive filtering stages;

wherein data output by each stage of said multi-stage filter which is not part of said subset of said image data to be filtered by a subsequent filtering stage is supplied to said data buffer means; and means for combining image data output by the last of said filtering stages and image data buffered in said data buffer means.

2. Apparatus according to claim 1, in which for each of the subsequent filtering stages, the subset of image data consists of one of said spatial frequency bands output by said preceding filtering stage.

3. Apparatus according to claim 1, in which said multi-stage filter is a three-stage filter.

4. Apparatus according to claim 1, in which said multi-stage filter and said data buffer means are disposed on separate respective integrated circuit substrates.

5. Apparatus according to claim 1, in which each stage of said multi-stage filter comprises one or more multi-tap finite impulse response digital filters.

6. Apparatus according to claim 1, wherein said multi-stage filter compresses said image data.

7. Apparatus according to claim 1, wherein said multi-stage filter is an integrated circuit provided on a single application specific integrated circuit.

8. Apparatus for frequency-separating input image data, the apparatus comprising:

a data buffer, a multi-stage filter for performing successive spatial filtering operations on input image data, said multi-stage filter having:

(i) a first filtering stage for frequency-separating said input image data into image data representing at least two spatial frequency bands; and (ii) one or more subsequent filtering stages for receiving a subset of image data output by said preceding filtering stage and frequency-separating that image data into image data representing two or more spatial frequency bands;

in which data output by each stage which is not part of said subset of said image data to be filtered by a subsequent filtering stage is supplied to said data buffer; and means for combining image data output by the last of said filtering stages and image data buffered in said data buffer, in which each filtering stage performs horizontal decimation by a decimation factor of two and vertical decimation by a decimation factor of two, thereby performing frequency separation into four spatial frequency bands.

9. Apparatus for frequency-separating input image data, the apparatus comprising:

a data buffer, a multi-stage filter for performing successive spatial filtering operations on input image data, said multi-stage filter having:

(i) a first filtering stage for frequency-separating said input image data into image data representing at least two spatial frequency bands; and (ii) one or more subsequent filtering stages for receiving a subset of image data output by said preceding filtering stage and frequency-separating that image data into image data representing two or more spatial frequency bands;

in which data output by each stage which is not part of said subset of said image data to be filtered by a subsequent filtering stage is supplied to said data buffer; and means for combining image data output by the last of said filtering stages and image data buffered in said data buffer, in which said multi-stage filter comprises a single filter device for performing each filtering operation of said multi-stage filtering process, in which the subset of data output by said device at each stage in the multi-filtering process is fed back to said input of said device.

10. Apparatus for frequency-combining frequency-separated input image data, said apparatus comprising:

data buffer means for buffering data, a multi-stage filter for performing successive spatial filtering operations on input image data;

means for demultiplexing said input image data into a first subset to be supplied to a first stage of said multi-stage filter and a second subset to be buffered in said data buffer means;

said multi-stage filter having filtering stages including:

(i) a first filtering stage for frequency-combining said first subset of said input image data; and (ii) one or more subsequent filtering stages for frequency-combining said image data output by a preceding filtering stage with further image data from said second subset buffered in said data buffer means;

wherein each filtering stage of said multi-stage filter includes a horizontal/vertical interpolation stage comprised of a horizontal filtering stage and a vertical filtering stage for performing respective horizontal/vertical interpolation on said image data and a line buffer for storing vertical lines of a subset of image data output from a preceding filtering stage, wherein each line buffer is smaller in buffer size in preceding filtering stages.

11. Apparatus according to claim 10, wherein said multi-stage filter compresses said image data.

12. Apparatus according to claim 11, further comprising digital video tape recording/reproducing means for recording/reproducing the compressed image data.

13. Apparatus according to claim 10, wherein said multi-stage filter is an integrated circuit provided on a single application specific integrated circuit.

14. A method of frequency-separating input image data using a multi-stage filter having filtering stages, each filtering stage including a horizontal/vertical decimation stage comprised of a horizontal filtering stage and a vertical filtering stage for performing respective horizontal/vertical decimation on said image data and a line buffer for storing vertical lines of said image data, wherein each line buffer is smaller in buffer size in successive filtering stages, said method comprising the steps of:

performing a first filtering operation to frequency-separate said input image data into image data representing at least two spatial frequency bands;

performing one or more subsequent frequency-separating filtering operations, each subsequent operation comprising filtering a subset of said data output by said preceding filtering operation;

buffering data output by each filtering operation which is not part of said subset of said image data to be filtered by a subsequent filtering operation in a data buffer; and combining image data output by the last of said filtering operations and image data buffered in said data buffer.

15. Method according to claim 14, further comprising the step of providing said multi-stage filter on a single application specific integrated circuit.

16. A method of frequency-combining frequency-separated input image data using a multi-stage filter having filtering stages, each filtering stage including a horizontal/vertical interpolation stage comprised of a horizontal filtering stage and a vertical filtering stage for performing respective horizontal/vertical interpolation on said image data and a line buffer for storing vertical lines of said image data, wherein each line buffer is smaller in buffer size in preceding filtering stages, said method comprising the steps of:

demultiplexing said input image data into a first subset and a second subset;

buffering said second subset of image data in a data buffer;

performing a first frequency-combining filtering operation on said first subset of said input image data; and performing one or more subsequent frequency-combining filtering stages, each operating on said image data output by said preceding filtering stage and further image data from said second subset buffered in said data buffer.

17. Method according to claim 16, further comprising the step of providing said multi-stage filter on a single application specific integrated circuit.

* * * * *